(12) United States Patent
Kim et al.

(10) Patent No.: US 9,557,639 B2
(45) Date of Patent: Jan. 31, 2017

(54) METHOD OF PATTERNING BLOCK COPOLYMER LAYER AND PATTERNED STRUCTURE

(71) Applicants: SAMSUNG ELECTRONICS CO., LTD., Suwon-si, Gyeonggi-do (KR); Yonsei University, University—Industry Foundation(UIF), Seoul (KR)

(72) Inventors: Mi-Jeong Kim, Hwaseong-si (KR); In Taek Han, Seoul (KR); June Huh, Seoul (KR); Seong-Jun Jeong, Ulsan-si (KR); Haeng Deog Koh, Hwaseong-si (KR); Youn Jung Park, Seoul (KR)

(73) Assignees: SAMSUNG ELECTRONICS CO., LTD., Gyeonggi-Do (KR); YONSEI UNIVESITY, UNIVERSITY-INDUSTRY FOUNDATION(UIF), Seoul (KR)

( * ) Notice: Subject to any disclaimer, the term of this patent is extended or adjusted under 35 U.S.C. 154(b) by 417 days.

(21) Appl. No.: 14/078,921

(22) Filed: Nov. 13, 2013

(65) Prior Publication Data

US 2014/0193614 A1 Jul. 10, 2014

(30) Foreign Application Priority Data

Jan. 8, 2013 (KR) ........................ 10-2013-0002220

(51) Int. Cl.
*G03F 7/00* (2006.01)
*B82B 3/00* (2006.01)
(Continued)

(52) U.S. Cl.
CPC ........... *G03F 7/0002* (2013.01); *B82B 3/0066* (2013.01); *B82Y 30/00* (2013.01); *B82Y 40/00* (2013.01); *Y10T 428/24802* (2015.01)

(58) Field of Classification Search
CPC ........... Y10T 428/24802; G03F 7/0002; H01L 21/027
See application file for complete search history.

(56) References Cited

U.S. PATENT DOCUMENTS

| 8,133,534 B2 | 3/2012 | Stoykovich et al. |
| 2010/0311613 A1 | 12/2010 | Busnaina et al. |
| 2012/0009390 A1 | 1/2012 | Yang et al. |

FOREIGN PATENT DOCUMENTS

JP 2012-061531 A 3/2012

OTHER PUBLICATIONS

Cheng et al, "Templated Self-Assembly of Black copolymers: Effect of Substrate Topography", Advanced Materials, vol. 15, No. 19, Oct. 2, 2003, pp. 1599-1602.
(Continued)

*Primary Examiner* — Gerard Higgins
(74) *Attorney, Agent, or Firm* — Cantor Colburn LLP

(57) ABSTRACT

A method of patterning a block copolymer layer, the method including: providing a substrate with a guide pattern formed on a surface thereof; forming a block copolymer layer on the substrate with the guide pattern, the block copolymer layer including a block copolymer; and directing self-assembly of the block copolymer on the substrate according to the guide pattern to form n/2 discrete domains, wherein the guide pattern includes a block copolymer patterning area having a 90-degree bending portion, and an outer apex and an inner apex of the 90-degree bending portion are each rounded, the outer apex having a first curvature radius $r_1$, and the inner apex having a second curvature radius $r_2$, respectively, and the width of the patterning area W, the first curvature radius $r_1$ and the second curvature radius $r_2$, satisfy Inequation 1:

(Continued)

$$2 + \sqrt{2} - (1 + \sqrt{2})\left[\frac{(n+2)^2}{n(n+1)}\right]^{\frac{1}{3}} \leq \quad \text{Inequation 1}$$

$$\frac{r_1 - r_2}{W} \leq 2 + \sqrt{2} - (1 + \sqrt{2})\left[\frac{(n-2)^2}{n(n-1)}\right]^{\frac{1}{3}}.$$

8 Claims, 5 Drawing Sheets

(51) Int. Cl.
    *B82Y 40/00*      (2011.01)
    *B82Y 30/00*      (2011.01)

(56) References Cited

OTHER PUBLICATIONS

Jung et al, "Orientation-controlled Self-Assembled Nanolithography Using a Polystyrene-Polydimethylsiloxane Block Copolymer", Nano Letters, vol. 7, No. 7, 2007, pp. 2046-2050.

Liu et al., "Integration of Density Multiplication in the Formation of Device-Oriented Structures by Directed Assembly of Block Copolymer-Homopolymer Blends", Advanced functional Materials, vol. 20, Issue 8, Apr. 23, 2010, pp. 1251-1257.

Liu et al, "Fabrication of chevron patterns for patterned media with block copolymer directed assembly", Journal of Vacuum Science & Technology B, vol. 29, Issue 6, Nov. 2011, pp. 06F204-1-06F204-7.

Matthew S. Turner, "Equilibrium Properties of a Diblock Copolymer Lamellar Phase confined between Flat Plates", Physical Review Letters, vol. 69, No. 12, Sep. 21, 1992, pp. 1788-1791.

Sanders et al., "Intergration of Directed Self-Assembly with 193nm Lithography", Journal of Photopolymer Science and Technology, vol. 23, Issue 1, 2010, pp. 11-18.

Stoykovich et al., "Directed Self-Assembly of Block copolymers for Nanolithography: Fabrication of Isolated Features and Essential Integrated Circuit Geometries", ACSNano, vol. 1, No. 3, 2007, pp. 168-175.

Stoykovich et al., "Directed Assembly of Block Copolymer Blends into Nonregular Device-Oriented Structures", Science, vol. 308, Jun. 3, 2005, pp. 1442-1446.

Wilmes et al., "Bending Soft Block Copolymer Nanostructures by Lithographically Directed Assembly", Macromolecules, vol. 39, Issue 7, Apr. 4, 2006, pp. 2435-2437.

METHOD OF PATTERNING BLOCK COPOLYMER LAYER AND PATTERNED STRUCTURE

CROSS-REFERENCE TO RELATED APPLICATION

This application claims priority to and the benefit of Korean Patent Application No. 10-2013-0002220, filed on Jan. 8, 2013, and all the benefits accruing therefrom under 35 U.S.C. §119, the entire contents of which are incorporated herein by reference.

BACKGROUND

1. Field

A method of patterning a block copolymer layer and a patterned structure are disclosed.

2. Description of the Related Art

Recently, demand for lithography technology for forming a high-resolution nano-sized pattern for fabricating a semiconductor memory or a logic circuit has increased in accordance with a decrease in a size of electronic devices and an increase in an integration degree of semiconductor devices. Conventional photolithography technology have difficulties in providing a nano-sized pattern, in particular, a nano-pattern having features of less than or equal to about 20 nm due to the wavelength resolution limit. In this regard, a method of forming a higher resolution pattern using a resolution enhancement technique ("RET") has been suggested, and research to develop optical lithography using an extreme ultraviolet ("EUV") wavelength of 13.5 nm or non-optical patterning lithography, such as directed self-assembly lithography (hereinafter referred to as "DSA") is ongoing.

Thus there remains a need for an improved patterning method to provide materials suitable for semiconductor fabrication.

SUMMARY

One embodiment provides a method of forming a nano-pattern having a 90-degree bending portion without defects using a block copolymer.

Another embodiment provides a polymeric structure having a pattern including a 90-degree bending portion.

Yet another embodiment provides a trench-patterned nanostructure having a 90-degree bending portion.

One embodiment provides a method of patterning a block copolymer layer, the method including: providing a substrate with a guide pattern formed on a surface thereof; forming a block copolymer layer on the substrate with the guide pattern, the block copolymer layer including a block copolymer; and directing self-assembly of the block copolymer according to the guide pattern to form n/2 discrete domains, wherein the guide pattern includes a block copolymer patterning area having a 90-degree bending portion, an outer apex and an inner apex of the 90-degree bending portion are each rounded, the outer apex has a first curvature radius $r_1$, the inner apex has a second curvature radius $r_2$, and a width of the block copolymer patterning area W, the first curvature radius $r_1$, and the second curvature radius $r_2$, satisfy Inequation 1:

$$2 + \sqrt{2} - (1+\sqrt{2})\left[\frac{(n+2)^2}{n(n+1)}\right]^{\frac{1}{3}} \leq \quad \text{Inequation 1}$$

$$\frac{r_1 - r_2}{W} \leq 2 + \sqrt{2} - (1+\sqrt{2})\left[\frac{(n-2)^2}{n(n-1)}\right]^{\frac{1}{3}},$$

wherein, n is an even number and represents the number of interfaces of the discrete domains.

In an embodiment, "n" may be an even number of greater than or equal to 4. Furthermore, a pattern period in a bulk phase of the block copolymer $\lambda_o$, and the width of the block copolymer patterning area W, may satisfy the equation:

$$W = \frac{n}{2}\lambda_o$$

As used herein, the term "bulk phase" refers to a product being phase-separated without any external factor limiting the pattern formation. As used herein, the term "pattern period" refers to a distance between the adjacent domains among the repeating discrete domains or in the bulk phase. For example, when the domains form an ABAB lamellar structure, the sum of the thickness of an A layer and the thickness of a B layer becomes the period of the discrete domains.

The width of the patterning area (W) may equal to the length of a straight line ($W_d$) that connects the inner apex and the outer apex of the 90-degree bending portion in the guide pattern.

The guide pattern may be formed by chemical patterning, topographical patterning, optical patterning, electrical patterning, mechanical patterning, or a combination thereof.

The substrate may include an organic monomolecular layer or a polymer brush layer.

The discrete domains of the self-assembled block copolymer may comprise a lamellar structure which is vertically oriented relative to the substrate, or a cylindrical structure which is horizontally oriented relative to the substrate.

The patterning method may further include selectively removing a portion of the discrete domains of the self-assembled block copolymer.

The guide pattern may include a first bend pattern elements disposed parallel to a second bend pattern element, a first jog pattern element disposed parallel to a second jog pattern element, or a combination thereof.

In another embodiment, provided is a polymer structure including a substrate and a polymeric layer having a pattern and disposed on the substrate, wherein the pattern of the polymeric layer has a 90-degree bending portion, wherein the pattern of the polymeric layer is formed by directing self-assembly of a block copolymer on the substrate according to a guide pattern to form n/2 discrete domains, and selectively removing some of the discrete domains, wherein the guide pattern includes a block copolymer patterning area having a 90-degree bending portion, an outer apex and an inner apex of the 90-degree bending portion are each rounded, the outer apex has a first curvature radius $r_1$, the inner apex has a second curvature radius $r_2$, and a width of the block copolymer patterning area W, the first curvature radius $r_1$, and the second curvature radius $r_2$, satisfy Inequation 1:

$$2 + \sqrt{2} - (1+\sqrt{2})\left[\frac{(n+2)^2}{n(n+1)}\right]^{\frac{1}{3}} \leq \quad \text{Inequation 1}$$

-continued $$\frac{r_1 - r_2}{W} \leq 2 + \sqrt{2} - (1 + \sqrt{2})\left[\frac{(n-2)^2}{n(n-1)}\right]^{\frac{1}{3}}$$

wherein n is an even number and represents the number of interfaces of the discrete domains.

In an embodiment, "n" may be an even number of greater than or equal to 4, and "W" may satisfy the following equation:

$$W = \frac{n}{2}\lambda_o$$

In the above equation, $\lambda_o$ denotes a pattern period in the bulk phase of the block copolymer.

The discrete domains of the self-assembled block copolymer may provide a lamellar structure which is vertically oriented relative to the substrate, or a cylindrical structure which is horizontally oriented relative to the substrate.

The substrate may include an organic monomolecular layer or a polymer brush layer.

The pattern of the deposited polymer may include a bend unit pattern, a jog unit pattern, or a combination thereof.

The substrate may include a polymer, a metal, a metal oxide, a metal nitride, or a combination thereof.

In another embodiment, provided is a trench-patterned structure having a nano-sized pattern including a 90-degree bending portion, wherein the structure includes a polymer, a metal, a metal oxide, a metal nitride, or a combination thereof, and the nano-sized pattern is transferred from a block copolymer nanopattern that is formed by directing self-assembly of a block copolymer on a substrate according to a guide pattern to form n/2 discrete domains and selectively removing some of the discrete domains, wherein the guide pattern includes a block copolymer patterning area having a 90-degree bending portion, an outer apex and an inner apex of the 90-degree bending portion are each rounded, the outer apex has a first curvature radius $r_1$, the inner apex has a second curvature radius $r_2$, and a width of the block copolymer patterning area W, the first curvature radius $r_1$, and the second curvature radius $r_2$, satisfy Inequation 1:

$$2 + \sqrt{2} - (1 + \sqrt{2})\left[\frac{(n+2)^2}{n(n+1)}\right]^{\frac{1}{3}} \leq \quad \text{[Inequation 1]}$$

$$\frac{r_1 - r_2}{W} \leq 2 + \sqrt{2} - (1 + \sqrt{2})\left[\frac{(n-2)^2}{n(n-1)}\right]^{\frac{1}{3}}$$

wherein, n is an even number and represents the number of interfaces of the discrete domains.

In an embodiment, "n" may be an even number of greater than or equal to 4, and "W" may satisfy the following equation.

$$W = \frac{n}{2}\lambda_o$$

In the above equation, $\lambda_o$ denotes a pattern period in the bulk phase of the block copolymer.

The nano-sized pattern may include a bend unit pattern, a jog unit pattern, or a combination thereof.

The structure may include at least one material selected from a metal selected from silicon, copper, chromium, iron, aluminum, hafnium, and gallium, oxides thereof, nitrides thereof, glass, an insulating polymer, and a conductive polymer.

The nano-sized pattern may have a line width of less than or equal to about 50 nm.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
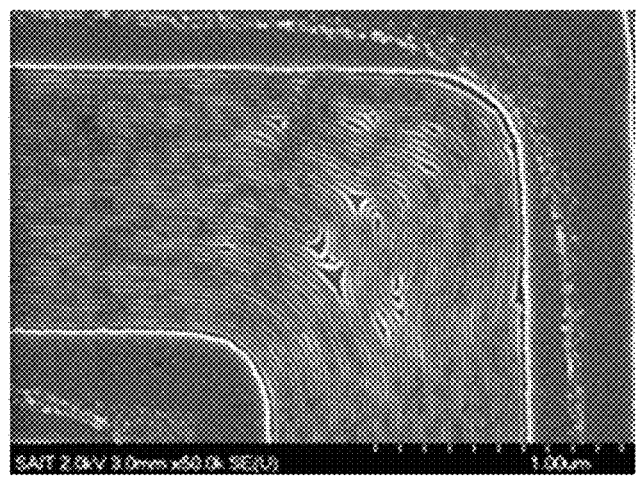
FIG. 1 shows a 90-degree bend pattern formed by directed self-assembly lithography using a block copolymer.

Advantages and characteristics of this disclosure and a method for achieving the same will become evident referring to the following exemplary embodiments together with the drawings attached hereto. However, this disclosure may be embodied in many different forms and is not be construed as limited to the embodiments set forth herein; rather, these embodiments are provided so that this disclosure will full and complete. Therefore, in some embodiments, process technologies known to those skilled in the art or can be determined without undue experimentation are not explained in detail for conciseness.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Unless otherwise mentioned, all terms in the specification (including technical and scientific terms) may be commonly understood by the one skilled in the art pertaining by the present invention. Terms defined in a generally-used dictionary are not to be interpreted ideally or exaggeratedly unless clearly defined. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

The exemplary embodiments described in the specification are explained referring to ideal exemplary drawings of schematic diagrams. Therefore, the parts exemplified in the drawings have outline properties and they are not to limit the categories of the invention. The same reference numerals designate the same constituent elements throughout the specification.

Block copolymers ("BCP") include at least two polymer blocks, each having two different physical and/or chemical characteristics and being linked to each other via a chemical covalent bond. The polymer blocks in the block copolymer are self-assembled and microphase-separated into nano-sized discrete domains during thermal annealing under appropriate conditions. Specifically, the block copolymers may be microphase-separated to form a lamellar structure, a spherically shaped structure, a cylindrically shaped structure, and the like by an annealing at a selected temperature. The directed self-assembly ("DSA") lithography is a technology using such a self-assembly phenomenon of the block copolymer.

DSA lithography would desirably be able to provide various and complicated geometrical patterns in order to be applied to the fabrication of a device. For example, the Semiconductor Industry Association has selected nine essential geometrical patterns in total as a unit pattern for nanomanufacturing, among which are included seven types including a periodic line, a bend, a T-junction, a periodic spot, a jog, an isolated line, and an isolated spot, and two types including a combination of the line and the jog and a gate layer consisting of the T-junction and the bend. The bend structure having a 90-degree bending portion is desirable for forming a jog and a gate layer, and thus, is one of pattern shapes that would be desirably be developed for the directed self-assembly ("DSA") lithography method.

In an embodiment, a method of patterning a block copolymer layer includes providing, e.g., preparing, a substrate with a guide pattern formed on a surface thereof, forming a block copolymer layer on the substrate with the guide pattern, the block copolymer layer comprising a block copolymer, and directing self-assembly of the block copolymer according to the guide pattern to form n/2 discrete domains. The guide pattern includes a block copolymer patterning area having a 90-degree bending portion with an outer apex and an inner apex of the 90-degree bending portion being rounded so as to have a first curvature radius $r_1$ and a second curvature radius $r_2$, respectively, and wherein the width of the patterning area W, the first curvature radius $r_1$, and the second curvature radius $r_2$ satisfy Inequation 1.

$$2 + \sqrt{2} - (1 + \sqrt{2}) \left[ \frac{(n+2)^2}{n(n+1)} \right]^{\frac{1}{3}} \leq \qquad \text{Inequation 1}$$

-continued
$$\frac{r_1 - r_2}{W} \leq 2 + \sqrt{2} - (1 + \sqrt{2}) \left[ \frac{(n-2)^2}{n(n-1)} \right]^{\frac{1}{3}}$$

In Inequation 1, n is an even number and represents the number of interfaces of the discrete domains, W is the width of a block copolymer patterning area, $r_1$ is a first curvature radius at the outer apex of the block copolymer patterning area, and $r_2$ is a second curvature radius at the inner apex of the block copolymer patterning area.

The patterning area is defined by pattern elements (E1 and E2 in FIG. 2), which are disposed having portions thereof parallel to one another. As used herein, the term "width of the patterning area W" refers to a width measured vertically relative to the longitudinal direction of the pattern elements (corresponding to "$W_1$" in FIG. 2). In other words, in FIG. 2, the width refers to the distance between opposite side walls in a straight line portion of the guide pattern. The guide pattern may include at least two bend pattern elements arranged parallel to one another, at least two jog pattern elements arranged parallel to one another, or a combination thereof. The number of interfaces of the discrete domains n may be an even number of greater than or equal to about 4, and it may be, for example, less than or equal to about 100, but is not limited thereto.

The guide pattern may enable the discrete domains of the self-assembled block copolymer to form a directed pattern.

On a substrate not having a guide pattern, the block copolymer is disorderly self-assembled. However, on a substrate having a guide pattern, it may be self-assembled in a predetermined direction to form a pattern. Directed self-assembly ("DSA") lithography uses such a directed self-assembly phenomenon of the block copolymer. DSA lithography may facilitate the formation of a nano-sized line pattern, and the pattern thus obtained may have fewer defects. However, when the DSA lithography is used to form a block copolymer pattern including a 90-degree bending portion such as a bend and a jog, the pattern thus obtained may have many defects around the apex of the 90-degree bending portion. FIG. 1 is a SEM image showing a horizontal cylindrical structure obtained by thermal annealing of a PS-b-PMMA block copolymer (46 k-21 k) in a 90-degree bend guide pattern. As shown in FIG. 1, the defect density of the pattern sharply increases in the apex of the 90-degree bending portion.

In this regard, there was an attempt to resolve such problems to provide a bend structure with fewer or no defect by using as a self-assembly material a combination of an A-b-B block copolymer with an A-homopolymer and a B-homopolymer. However, according to such an attempt, the polymer composition in the line portion differs from the polymer composition in the bend portion so that the critical dimension of the pattern fails to be maintained at a constant value when a line pattern unit and a bend pattern unit co-exist in the same layer.

Figure 2:
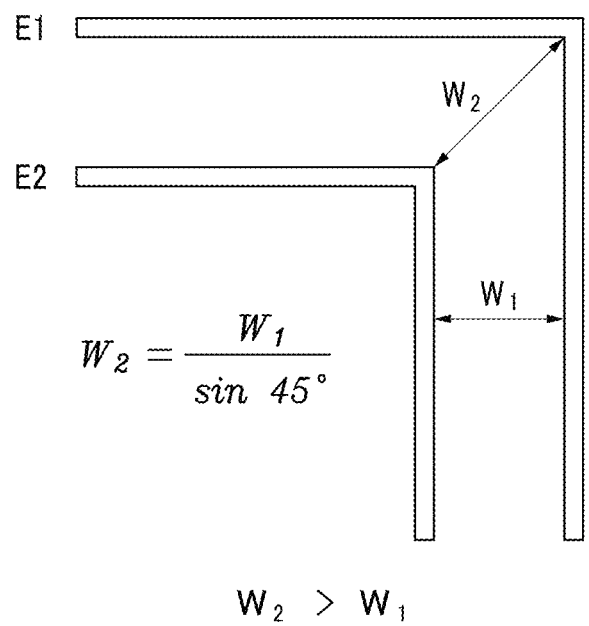
FIG. 2 schematically illustrates an embodiment of a guide pattern for the formation of a 90-degree bend pattern.

In photolithography, exposure areas may be selected by using a mask. By contrast, in the DSA lithography, the width of the guide pattern may control the number of self-assembled discrete domains of a block copolymer ("BCP"). In other words, the guide pattern with a constant line width W makes it possible to maintain the number of self-assembled nanostructures of the block copolymer at a constant value. However, as shown in FIG. 2, in a sharp-cornered guide pattern for forming a 90-degree bending portion such as a bend unit pattern, the width of a patterning area at the apex of the bending portion $W_2$ is greater than the width of the patterning area at the line portion $W_1$ (in other words, $W_2$ equals to $W_1/\sin 45°$). While not wanting to be bound by theory, it is understood that using such a guide pattern to form a BCP nanopattern including a 90-degree bending portion (for example, a bend or jog pattern) may lead to an increased number of the discrete domains (e.g., a line) of the directed self-assembled block copolymer around the apex of a bending portion, and thereby more defects, such as dislocation defects, may occur.

Figure 3:
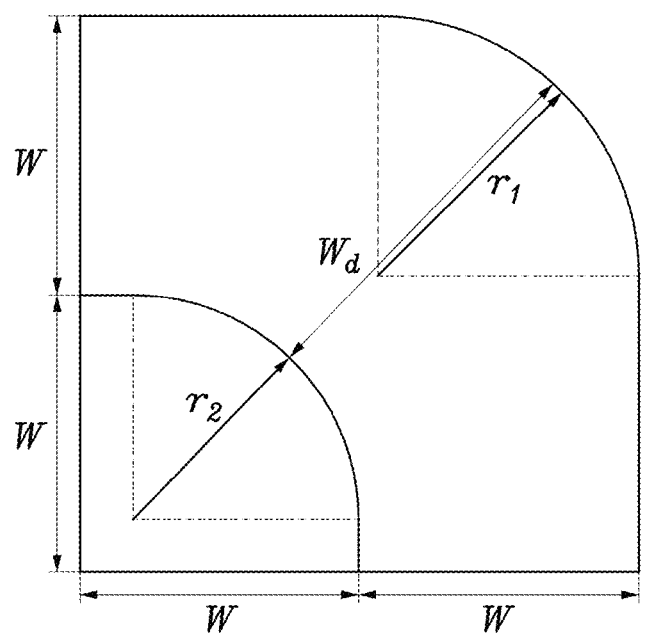
FIG. 3 schematically illustrates another embodiment of a guide pattern for the formation of a 90-degree bend pattern.

However, in the guide pattern including the 90 degree bending portion, it is possible to keep the number of the discrete domains of the self-assembled block copolymer in the patterning area at a constant value when the 90 degree bending portion is rounded in such a manner that the length of the straight line connecting between its inner apex and its outer apex is controlled to satisfy Inequation 2, as illustrated in FIG. 3:

$$W^*(n-2) \leq W_d \leq W^*(n) \quad \text{Inequation 2}$$

In the above inequation, n, which is an even number, represents a total number of interfaces of the discrete domains formed by the self-assembled block copolymer in the patterning area, and thus, n/2 is the total number of discrete domains. $W_d$ is the length of a straight line connecting the inner apex and the outer apex of the 90-degree bending portion. $W^*(n)$ is a critical trench width that is desirable for the translation from n interfaces to n+2 interfaces, and it may be represented by Equation 1 as follows.

$$\frac{W^*(n)}{\lambda_o} = \frac{1}{2}\left[\frac{n^2(n+2)^2}{n+1}\right]^{\frac{1}{3}} \quad \text{Equation 1}$$

In Equation 1, $\lambda_o$ denotes a pattern period in the bulk phase of the block copolymer, and n and $W^*(n)$ are the same as defined above.

On the other hand, in FIG. 3, the relationship among the width of the patterning area W, the width of the patterning area in a bending portion apex Wd, the first curvature radius $r_1$, and the second curvature radius $r_2$, may be represented by Equation 2 as follows.

$$W_d = \sqrt{2}W - (\sqrt{2}-1)\cdot(r_1-r_2) \quad \text{Equation 2}$$

Wd, W, $r_1$ and $r_2$ are the same as defined above.

When the pattern period in the bulk phase of the block copolymer is $\lambda_o$, a guide pattern may desirably have a width corresponding to an integer multiple of $\lambda_o$ in order for the pattern of the block copolymer formed in the guide pattern to show a minimum number of defects.

Specifically, in the guide pattern, a period commensurability represented by Equation 3 is present between the width of the (block copolymer) patterning area W and the pattern period in the bulk phase of the block copolymer $\lambda_o$.

$$W = \frac{n}{2}\lambda_o \quad \text{Equation 3}$$

As a result, Inequation 1 is derived from Inequation 2, Equation 1, Equation 2, and Equation 3.

$$2+\sqrt{2}-(1+\sqrt{2})\left[\frac{(n+2)^2}{n(n+1)}\right]^{\frac{1}{3}} \leq \quad \text{Inequation 1}$$

-continued $$\frac{r_1-r_2}{W} \leq 2+\sqrt{2}-(1+\sqrt{2})\left[\frac{(n-2)^2}{n(n-1)}\right]^{\frac{1}{3}}$$

Without being bound by any theory, Inequation 1 may be considered as a thermodynamically necessary condition for patterning a layered structure having the number of interfaces n, with no defect at a 90-degree bending portion.

Accordingly, it is possible to form a block copolymer nano-pattern with substantially no defect when the 90-degree bending portion of the guide pattern having a width of the patterning area W is rounded in such a controlled manner that the first curvature radius at the outer apex $r_1$, the second curvature radius at the inner apex $r_2$, and the width W, satisfy the relationship of the above Inequation 1. In Inequation 1, the first curvature radius at the outer apex $r_1$, is greater than the second curvature radius of the inner apex $r_2$. Inequation 1 may be considered as a condition for maintaining tracks of discrete domains of the block copolymer microphase-separated by self-assembly at the bending portion in the BCP patterning area of the guide pattern. In addition, it may be inferred from Inequation 1 that as the number of discrete domains n/2 or the width of the patterning area W increases while keeping the period of the discrete domains at a constant value, the range of the combination of the curvature radius $r_1$ and the curvature radius $r_2$ satisfying Inequation 1 becomes smaller.

Figure 4:
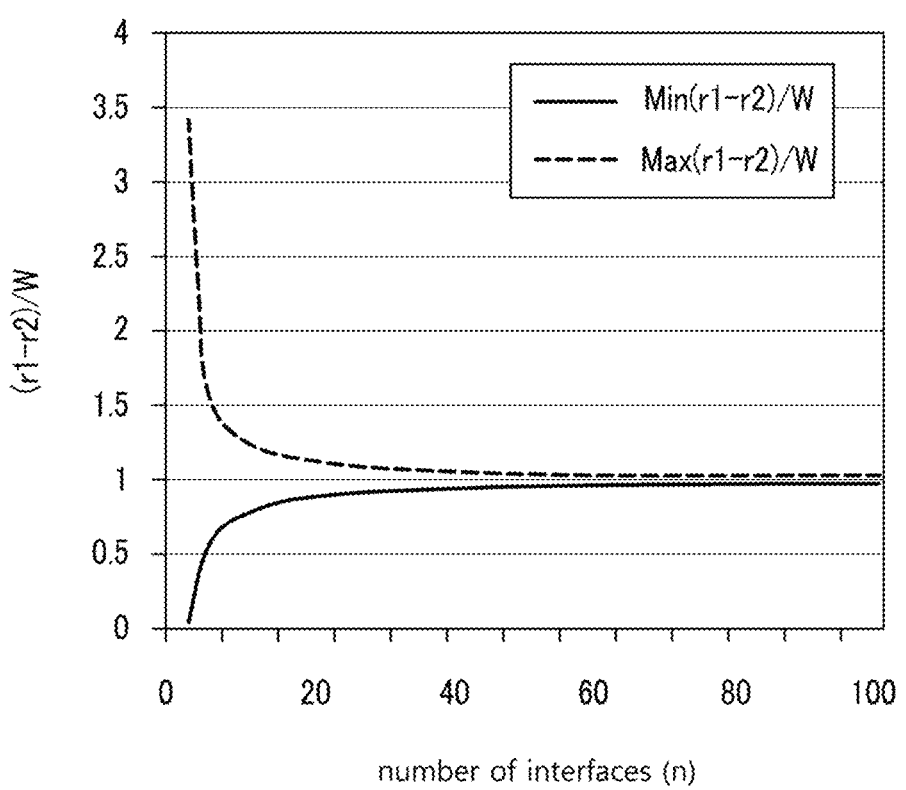
FIG. 4 shows a graph of a maximum value of $(r_1-r_2)/W$ and a minimum value of $(r_1-r_2)/W$ versus the number of interfaces of A block domains and B block domains (n) prepared by the self-assembly of an A-b-B block copolymer.

FIG. 4 shows a graph plotting the upper limit of $(r_1-r_2)/W$ and the lower limit of $(r_1-r_2)/W$ as the number of the interfaces of the discrete domains of a self-assembled A-b-B block copolymer increases. Referring to FIG. 4, as the width of the patterning area W in a guide pattern is increased and the number of the discrete domains of the block copolymer n/2 becomes larger, realizing a DSA pattern with no defects requires that the width of the block copolymer patterning area W substantially corresponds to the difference of the curvature radius $(r_1-r_2)$. This means that the guide pattern is desirably designed and fabricated with higher precision. In other words, when the BCP patterning area in the guide pattern is designed to have a smaller width, the guide pattern may cause no defects at the 90-degree bending portion even when the guide pattern is fabricated with a lower degree of precision. For example, when the number of discrete domains of the block copolymer formed by directed self-assembly thereof is 6 (i.e., the number of interfaces is 12), a BCP pattern with no defects at the 90-degree bending portion may be obtained even when the difference between the outer and the inner curvature radiuses of the patterning area is greater than or less than the width at the straight line portion W by 20% (i.e., ±20% deviation with respect to W).

However, when the number of discrete domains of the block copolymer formed by directed self-assembly thereof is 12 (i.e., the number of interfaces is 24), the difference between the outer and the inner curvature radiuses may be adjusted to have a value within the width at the straight line portion (W) ±10% in order to obtain a flawless pattern.

The guide pattern may be prepared in any method. For example, the method may include chemical patterning, topographical patterning, optical patterning, electrical patterning, mechanical patterning, and any suitable method of selectively activating a surface of the substrate. The aforementioned methods may be used alone or in combination. These patterning methods may include a top-down patterning such as lithography, a bottom-up assembly, or a combination thereof. The topographical patterning may use X-ray lithography, extreme ultraviolet (UV) lithography, electron beam lithography, photolithography, interference lithography, and the like. By way of non-limiting example, the topographical patterning may include obtaining a groove pattern of a square waveform profile with a predetermined depth by using interference lithography and ion etching. Alternatively, the topographical patterning may include forming a pattern of a positive or a negative photoresist through the exposure and the development to obtain a trench pattern. The chemical patterning may form a guide pattern having no trench by chemically modifying the surface of a substrate (e.g., by the pattern formation of a monomolecular assembly layer or a polymer brush having affinity for a certain component of a block copolymer).

In the patterning method as set forth above, any suitable type of substrate may be used. For example, the substrate may include a polymer, a metal (including its alloys), a metal oxide, a metal nitride, and the like in a semiconductor field wherein the block copolymer may be used as a resist mask for an additional process. The specific example of the substrate may include, but are not limited to, a metal such as silicon, copper, chromium, iron, aluminum, hafnium, gallium, and the like, an oxide or nitride thereof (e.g., silicon oxide, hafnium oxide, aluminum oxide, and silicon nitride), glass, a conductive polymer (e.g., a flexible and conductive polymer film), an insulating polymer (e.g., a flexible and insulating polymer film), polyethylene, polyethylene terephthalate, polyimide, and the like.

The substrate may include a polymer brush or a self-assembled monolayer. The brush layer may be omitted when the block copolymer has suitable wetting properties for the substrate. Meanwhile, the brush layer may be used when the block copolymer does not have sufficient wetting properties for the substrate, or the substrate has low surface flatness.

Examples of the self-assembled monolayer include a monolayer of silane or a siloxane compound, for example, a self-assembled monolayer of octadecyltrichlorosilane. The polymer brush may include a homopolymer or copolymer of a monomer for the block copolymer material. For example, for PS-b-PMMA, it is possible to use a polymer brush including at styrene, methylmethacrylate (e.g., a hydroxyl-terminated polystyrene, PSOH, or PS-r-PMMA), or a combination thereof. By way of an example, when the block copolymer is polystyrene-b-polydimethylsiloxane (PDMS), the polymer brush may be PSOH or PDMS. The polymer brush or the self-assembled monolayer may be a neutral layer, the chemical affinity of which is the same for each component constituting the block copolymer. In another example, a guide pattern may be prepared by patterning the polymer brush or the self-assembled monolayer on the substrate in an appropriate manner (e.g. by photolithography, extreme ultraviolet ("UV") lithography, and the like).

As a block copolymer, it is possible to use any suitable copolymer that may be microphase-separated via self-assembly, and the types of the block copolymer are not particularly limited.

Non-limiting examples of the block copolymer may include a block copolymer including a styrene block or a derivative thereof and a (meth)acrylic acid ester block, a block copolymer including a styrene block or a derivative thereof and a siloxane block or a derivative thereof, a block copolymer including a styrene block or a derivative thereof and an olefin-based polymer block, a block copolymer including a styrene block or a derivative thereof and an alkylene oxide block, and a block copolymer including an alkylene oxide block and a (meth)acrylic acid ester block. The block copolymer may include at least two types of blocks. In addition, the block copolymer may be used alone or in a combination of at least one of the foregoing.

Specific examples of the (meth)acrylic acid ester may include, but are not limited to, (meth)acrylic acid methyl ester, (meth)acrylic acid ethyl ester, (meth)acrylic acid propyl ester, (meth)acrylic acid cyclohexyl ester, (meth)acrylic acid octyl ester, (meth)acrylic acid hydroxyethyl ester, (meth)acrylic acid hydroxypropyl ester, (meth)acrylic acid benzyl ester, (meth)acrylic acid anthracene ester, (meth)acrylic acid glycidyl ester, (meth)acrylic acid 3,4-epoxycyclohexylmethane ester, and (meth)acrylic acid propyl trimethoxysilane ester.

Specific examples of the styrene derivative may include, but are not limited to, alphamethyl styrene, 2-methyl styrene, 3-methyl styrene, 4-methyl styrene, 4-t-butyl styrene, 4-n-octyl styrene, 2,4,6-tri methyl styrene, 4-methoxy styrene, 4-t-butoxy styrene, 4-hydroxy styrene, 4-nitrostyrene, 3-nitrostyrene, 4-chlorostyrene, 4-fluorostyrene, 4-acetoxyvinyl styrene, 4-vinylbenzyl chloride, 1-vinyl naphthalene, 4-vinylbiphenyl, 1-vinyl-2-pyrrolidone, 9-vinyl anthracene, and vinyl pyridine.

Specific examples of the siloxane derivative may include, but are not limited to, dimethyl siloxane, diethyl siloxane, diphenyl siloxane, and methylphenyl siloxane.

Specific examples of the alkylene oxide may include, but are not limited to, ethylene oxide, propylene oxide, and butylene oxide.

Specific examples of the block copolymer may include, but are not limited to, a styrene-methylmethacrylate block copolymer ("PS-b-PMMA"), a styrene-methylacrylate block copolymer, a styrene-ethyl methacrylate block copolymer, a styrene-t-butyl methacrylate block copolymer, a styrene-methacrylic acid block copolymer, a styrene-butoxymethacrylate block copolymer, a styrene-ethylacrylate block copolymer, a styrene-acrylic acid block copolymer, a styrene-butadiene block copolymer ("PS-b-PB"), a styrene-isoprene block copolymer ("PS-b-PI"), a styrene-ethylenepropylene block copolymer ("PS-b-PEP"), a styrene-dimethylsiloxane block copolymer ("PS-b-PDMS"), a styrene-ethylene block copolymer ("PS-b-PE"), a styrene-vinylpyridine copolymer ("PS-b-P4VP"), and a styrene-ethylene oxide block copolymer ("PS-b-PEO").

The shape of the discrete domains formed by self-assembly of the block copolymer may be determined depending on the molecular weight ratio between the polymer components of the block copolymer. For example, when the block copolymer comprises the first and second polymer components immiscible with each other, the discrete domains formed by self-assembly may have a lamellar pattern and the ratio between the first and the second polymer components may range from about 40:60 to about 60:40, while the discrete domains formed through self-assembly may form a cylindrical pattern and the ratio between the first and second polymer components may range from about 20:80 to about 39:61.

The weight average molecular of the block copolymer is not particularly limited, and it may range from about 5000 g/mole to about 500,000 g/mole, specifically, about 5000 g/mole to about 300,000 g/mole, more specifically, about 5000 g/mole to about 100,000 g/mole, and much more specifically, about 5000 g/mole to about 50,000 g/mole.

The block copolymer layer with a suitable molar ratio of the monomers may be microphase-separated into a plurality of discrete domains by the annealing at a predetermined temperature. For example, an A-b-B copolymer layer may be microphase-separated into discrete domains of a polymer A (hereinafter referred to as $P_A$) and discrete domains of a polymer B (hereinafter referred to as $P_B$). The annealing temperature may be suitably chosen in light of the block copolymer being used. For example, the annealing may be performed at a temperature higher than or equal to the glass transition temperature of the block copolymer and lower than the thermal decomposition temperature thereof. By way of a non-limiting example, the annealing may be performed at a temperature of about 150° C. to about 350° C. In addition, the time for thermal annealing is not particularly limited and by way of an example, the annealing may be performed for about 1 minute to about 20 hours. Such annealing causes the block copolymer to be microphase-separated. The pattern period in a bulk phase of the block copolymer $\lambda_o$ is not particularly limited, and for example, it may range from about 5 nm to about 50 nm.

Some of the discrete domains (e.g., $P_A$ or $P_B$) may be removed by a suitable method. Methods for the selective removal are not particularly limited but it may be appropriately selected depending on the components of the discrete domains. For example, it is possible to use oxygen plasma, ozone treatment, UV irradiation treatment, thermal decomposition, chemical decomposition, $CF_4$ plasma, or a combination thereof. The $CF_4$ plasma may be used prior to using $O_2$ plasma when a PDMS block forms a thin film at the interface of air/film. Most of block copolymers are an organic-based, but when the block copolymer includes an inorganic composite, a different etching plasma source may be utilized in order to improve etching resistance.

In another embodiment, a polymer structure including a substrate and a deposited polymer forming a pattern on the substrate is provided. The pattern of the deposited polymer has a 90-degree bending portion, the pattern of the deposited polymer is formed by directing self-assembly of the block copolymer on the substrate according to a guide pattern to form n/2 discrete domains, and selectively removing some of the discrete domains, wherein the guide pattern includes a block copolymer patterning area having a 90-degree bending portion and the outer apex and the inner apex of the 90-degree bending portion are each rounded to have a first curvature radius $r_1$ and a second curvature radius $r_2$, respectively, and the width of the patterning area W, the first curvature radius $r_1$, and the curvature radius $r_2$ satisfy Inequation 1.

$$2 + \sqrt{2} - (1 + \sqrt{2}) \left[ \frac{(n+2)^2}{n(n+1)} \right]^{\frac{1}{3}} \leq$$

$$\frac{r_1 - r_2}{W} \leq 2 + \sqrt{2} - (1 + \sqrt{2}) \left[ \frac{(n-2)^2}{n(n-1)} \right]^{\frac{1}{3}}$$

Inequation 1

In the above inequation, n, W, $r_1$, and $r_2$ are the same as defined above.

Details for the substrate, the guide pattern, and the block copolymer are the same as set forth above. The pattern of the polymer structure may a line width of less than or equal to about 50 nm, and may have substantially no defect even at the 90-degree bending portion.

In another embodiment, a trench-patterned structure having a 90-degree bending portion is provided. The structure includes a polymer, a metal, a metal oxide, a metal nitride, or a combination thereof, and has a nano-sized pattern having a 90-degree bending portion. The nano-sized pattern may be transferred from a block copolymer nanopattern that is obtained by directing self-assembly of the block copolymer on a substrate according to a guide pattern to form n/2 discrete domains and selectively removing some of the discrete domains, wherein the guide pattern includes a block copolymer patterning area having a 90-degree bending portion and the outer apex and the inner apex of the 90-degree bending portion are each rounded to have a curvature radius $r_1$ and a curvature radius $r_2$, respectively, and the width of the patterning area W, the curvature radius $r_1$, and the curvature radius $r_2$ satisfy Inequation 1.

$$2 + \sqrt{2} - (1 + \sqrt{2}) \left[ \frac{(n+2)^2}{n(n+1)} \right]^{\frac{1}{3}} \leq$$

$$\frac{r_1 - r_2}{W} \leq 2 + \sqrt{2} - (1 + \sqrt{2}) \left[ \frac{(n-2)^2}{n(n-1)} \right]^{\frac{1}{3}}$$

Inequation 1

In the above inequation, n, W, $r_1$, and $r_2$ are the same as defined above. As used herein, the term "trench-patterned structure having a 90-degree bending portion" refers to a structure with a pattern having a 90-degree bend, such as a bend or a jog in its top view, and a trench and a mesa repeating with a constant period in its cross-sectional view, for example, a circuit pattern formed on a substrate.

Details for the substrate, guide pattern, and block copolymer are the same as set forth above. The pattern of the structure may have a line width of less than or equal to about 50 nm, and may have substantially no defect even at the 90-degree bending portion. The trench-patterned structure may be used as a circuit and the like in various electronic devices.

Hereinafter, the embodiments are illustrated in more detail with reference to examples. However, they are exemplary embodiments, and the present disclosure shall not be limited thereto.

EXAMPLES

Phase separation simulation of block copolymer with using a guide pattern rounded at the inner apex/outer apex of the 90-degree bending portion A simulation test is conducted for the phase separation in order to verify whether the number of discrete domains of BCP formed by self-assembly are kept at a substantially constant value when the BCP patterning area in the guide pattern satisfy the conditions derived from Inequation 1.

In this regard, dynamic Monte Carlo simulation is adopted to investigate lamella type pattern reproduction capability of the block copolymer with changing the inner curvature radius $r_1$ and outer curvature radius $r_2$ at a 90-degree bending portion.

Figure 5:
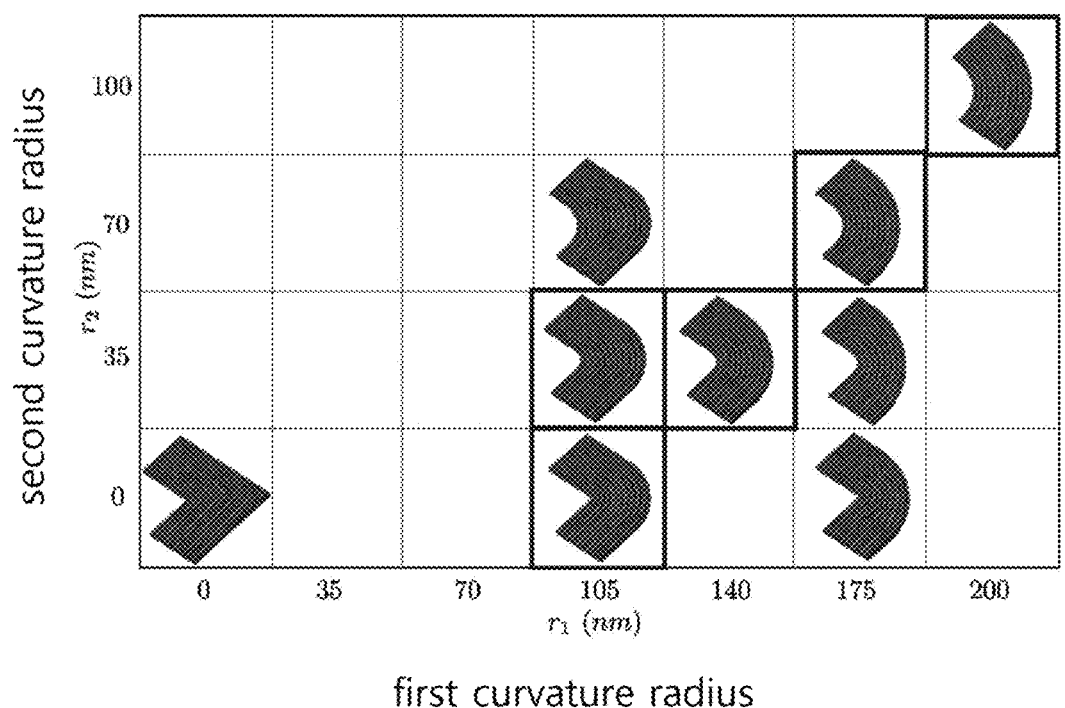
FIG. 5 shows morphological results of a simulation test for a directed self-assembly of the block copolymer for various combinations of the curvature radius at the outer apex of the 90-degree bend guide pattern $r_1$, and the curvature radius at the inner apex of the 90-degree bend guide pattern $r_2$.

The conditions used in the simulation test are as follows: N (a polymerization degree)=24 (M=15 kg/mole, $\lambda_o$=20 nm), $\chi N$=40 ($\chi$ is a Flory-Huggins interaction parameter), thickness of a block copolymer layer, h=10 nm, trench width at the straight line portion, W=100 nm, and the difference between mutual attraction coefficients of the trench wall surface and the block copolymer ($\Delta\chi w = \chi BW - \chi AW$) $\Delta\chi W$=2.0. In this regard, modeling is made such that the substrate ($\Delta\chi s = \chi Bs - \chi As$) and the surface meeting the air ($\Delta\chi v = \chi Bv - \chi Av$) are neutral to each block (i.e., $\Delta\chi s$=0, $\Delta\chi v$=0) in order to impart selectivity to one block. FIG. 5 shows DSA morphology change depending on a combination of the curvature radius $r_1$ and the curvature radius $r_2$. The simulation results as shown in FIG. 5 confirm that when the combination of the curvature radius $r_1$ and the curvature radius $r_2$ satisfy the conditions set forth in Inequation 1, it is possible to form an excellent DSA pattern with no defect (e.g., with no line split, no merge of lines, no line deformation, and the like).

Example of Pattern Formation Using the Guide Pattern

An 8-inch silicon wafer substrate is cleaned, a styrene-methylmethacrylate random copolymer is coated as a polymer brush on the substrate, a positive photoresist solution (solvent: toluene, concentration: 1 weight percent, wt %) is spin-coated (2500 revolutions per minute, "RPM") on the substrate, and then the obtained substrate is pre-baked. A photomask is fabricated to include a BCP patterning area as shown in FIG. 3, and through the photomask, exposing the photoresist film to light is conducted (with using a KrF scanner), and then the resulting film is developed to obtain a guide pattern on the substrate. The guide pattern has a trench width (W) of 296 nm, and $r_1$ is 500 nm and $r_2$ is 202 nm. A solution of polystyrene-b-polymethylmethacrylate (number average molecular weight: PS-b-PMMA 50 k-48 k) (the concentration: 0.5 wt %, the solvent being used: toluene) is spin-coated on the silicon wafer with the guide pattern formed thereon and annealed at a temperature of 280° C. for 30 minutes, directing microphase-separation into polystyrene domains and polymethylmethacrylate domains, which form a lamellar structure. The polymethylmethacrylate domains are removed with using $O_2$ reactive ion etching and thereby a patterned structure having a bend unit is obtained without any defects in the 90-degree bending portion.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of patterning a block copolymer layer, the method comprising:
    providing a substrate with a guide pattern formed on a surface thereof;
    forming a block copolymer layer on the substrate with the guide pattern, the block copolymer layer comprising a block copolymer; and
    directing self-assembly of the block copolymer on the substrate according to the guide pattern to form n/2 discrete domains,
wherein
    the guide pattern includes a block copolymer patterning area having a 90-degree bending portion,
    an outer apex and an inner apex of the 90-degree bending portion are each rounded,
    the outer apex has a first curvature radius $r_1$,
    the inner apex has a second curvature radius $r_2$, and
    a width of the block copolymer patterning area W, the first curvature radius $r_1$, and the second curvature radius $r_2$ satisfy Inequation 1:

$$2+\sqrt{2}-(1+\sqrt{2})\left[\frac{(n+2)^2}{n(n+1)}\right]^{\frac{1}{3}} \leq \frac{r_1-r_2}{W} \leq 2+\sqrt{2}-(1+\sqrt{2})\left[\frac{(n-2)^2}{n(n-1)}\right]^{\frac{1}{3}},$$ Inequation 1 wherein n is an even number and represents a number of interfaces of the discrete domains,
    wherein the guide pattern comprises at least two bend pattern elements arranged parallel to one another, at least two jog pattern elements arranged parallel to one another, or a combination thereof,
    wherein the block copolymer patterning area is defined by opposite side walls formed by the pattern elements,
    wherein the width (W) of the block copolymer patterning area is a distance between the opposite side walls in a straight line portion of the guide pattern, and
    wherein the discrete domains are formed in the block copolymer patterning area.

2. The method of claim 1, wherein n is an even number of greater than or equal to 4, and W satisfies the equation:

$$W = \frac{n}{2}\lambda_o$$

wherein $\lambda_o$ is a pattern period in a bulk phase of the block copolymer.

3. The method of claim 1, wherein a length of a straight line $W_d$ connecting the inner and outer apexes of the 90-degree bending portion in the guide pattern is equal to the width of the patterning area W.

4. The method of claim 1, wherein the guide pattern is formed by chemical patterning, topographical patterning, optical patterning, electrical patterning, mechanical patterning, or a combination thereof.

5. The method of claim 1, wherein the substrate comprises an organic monomolecular layer or a polymer brush layer.

6. The method of claim 1, wherein the discrete domains of the self-assembled block copolymer comprise a lamellar structure which is vertically oriented relative to the substrate, or a cylindrical structure which is horizontally oriented relative to the substrate.

7. The method of claim 1, further comprising selectively removing a portion of the discrete domains of the self-assembled block copolymer.

8. The method of claim 1, wherein the discrete domains are formed only in the block copolymer patterning area.

* * * * *